(12) United States Patent
Dhindsa et al.

(10) Patent No.: US 9,793,128 B2
(45) Date of Patent: Oct. 17, 2017

(54) PLASMA PROCESSING CHAMBER WITH DUAL AXIAL GAS INJECTION AND EXHAUST

(71) Applicant: Lam Research Corporation, Fremont, CA (US)

(72) Inventors: Rajinder Dhindsa, San Jose, CA (US); Alexei Marakhtanov, Albany, CA (US); Andrew D. Bailey, III, Pleasanton, CA (US)

(73) Assignee: Lam Research Corporation, Fremont, CA (US)

( * ) Notice: Subject to any disclaimer, the term of this patent is extended or adjusted under 35 U.S.C. 154(b) by 393 days.

(21) Appl. No.: 14/491,531

(22) Filed: Sep. 19, 2014

(65) Prior Publication Data

US 2015/0004793 A1    Jan. 1, 2015

Related U.S. Application Data

(62) Division of application No. 12/850,552, filed on Aug. 4, 2010, now Pat. No. 8,869,742.

(51) Int. Cl.
*H01L 21/3065* (2006.01)
*C23C 16/44* (2006.01)
(Continued)

(52) U.S. Cl.
CPC ...... *H01L 21/3065* (2013.01); *C23C 16/4412* (2013.01); *C23C 16/45565* (2013.01);
(Continued)

(58) Field of Classification Search
CPC . H01L 21/3065; H01L 21/31; C23C 16/4412; C23C 16/45565;
(Continued)

(56) References Cited

U.S. PATENT DOCUMENTS

| 4,134,425 A | * | 1/1979 | Gussefeld | ............. B01J 8/0278 |
| | | | | 137/625.3 |
| 4,209,357 A | * | 6/1980 | Gorin | ................. H01J 37/3244 |
| | | | | 156/345.34 |

(Continued)

FOREIGN PATENT DOCUMENTS

| CN | 1675738 A | 9/2005 |
| CN | 1816893 A | 8/2006 |

(Continued)

*Primary Examiner* — Rudy Zervigon
(74) *Attorney, Agent, or Firm* — Martine Penilla Group, LLP (57) ABSTRACT

An electrode is exposed to a plasma generation volume and is defined to transmit radiofrequency power to the plasma generation volume, and includes an upper surface for holding a substrate in exposure to the plasma generation volume. A gas distribution unit is disposed above the plasma generation volume and in a substantially parallel orientation to the electrode. The gas distribution unit includes an arrangement of gas supply ports for directing an input flow of a plasma process gas into the plasma generation volume in a direction substantially perpendicular to the upper surface of the electrode. The gas distribution unit also includes an arrangement of through-holes that each extend through the gas distribution unit to fluidly connect the plasma generation volume to an exhaust region. Each of the through-holes directs an exhaust flow from the plasma generation volume in a direction substantially perpendicular to the upper surface of the electrode.

18 Claims, 10 Drawing Sheets

(51) Int. Cl.
*C23C 16/455* (2006.01)
*C23C 16/50* (2006.01)
*H01J 37/32* (2006.01)
*H01L 21/31* (2006.01)

(52) U.S. Cl.
CPC .. C23C 16/45574 (2013.01); C23C 16/45576 (2013.01); C23C 16/50 (2013.01); H01J 37/32091 (2013.01); H01J 37/32449 (2013.01); H01J 37/32834 (2013.01); H01L 21/31 (2013.01)

(58) Field of Classification Search
CPC ........ C23C 16/45574; C23C 16/45576; C23C 16/50; H01J 37/32091; H01J 37/32449; H01J 37/32834
USPC ........ 438/485, 513, 788, 729, 798; 427/533, 427/569, 570, 906
See application file for complete search history.

(56) References Cited

U.S. PATENT DOCUMENTS

| | | | | |
|---|---|---|---|---|
| 4,579,618 | A * | 4/1986 | Celestino | H01J 37/32 156/345.34 |
| 4,590,042 | A * | 5/1986 | Drage | H01J 37/3244 156/345.34 |
| 4,780,169 | A * | 10/1988 | Stark | H01J 37/3244 156/345.34 |
| 5,087,341 | A * | 2/1992 | Tsukada | C23F 4/00 156/345.34 |
| 5,102,523 | A * | 4/1992 | Beisswenger | H01J 37/32009 118/723 E |
| 5,246,526 | A * | 9/1993 | Yamaguchi | H01L 21/67028 118/722 |
| 5,422,139 | A * | 6/1995 | Fischer | C23C 16/455 118/715 |
| 5,487,785 | A * | 1/1996 | Horiike | C23C 16/507 118/723 E |
| 5,496,410 | A * | 3/1996 | Fukuda | C23C 16/4401 118/723 MA |
| 5,614,026 | A * | 3/1997 | Williams | C23C 16/4412 118/723 ER |
| 5,888,907 | A | 3/1999 | Tomoyasu et al. | |
| 5,891,350 | A * | 4/1999 | Shan | H01J 37/32477 118/723 E |
| 5,976,261 | A * | 11/1999 | Moslehi | C23C 16/45574 118/719 |
| 6,074,488 | A | 6/2000 | Roderick et al. | |
| 6,162,323 | A * | 12/2000 | Koshimizu | H01J 37/3244 118/723 I |
| 6,432,831 | B2 * | 8/2002 | Dhindsa | C23C 16/455 438/710 |
| 6,537,418 | B1 * | 3/2003 | Muller | H01J 37/32834 118/715 |
| 6,565,661 | B1 * | 5/2003 | Nguyen | C23C 16/4557 118/715 |
| 6,800,139 | B1 * | 10/2004 | Shinriki | C23C 16/409 118/715 |
| 6,821,563 | B2 * | 11/2004 | Yudovsky | C23C 16/4412 427/248.1 |
| 6,821,910 | B2 * | 11/2004 | Adomaitis | C23C 16/4412 118/715 |
| 6,963,043 | B2 * | 11/2005 | Fink | H01J 37/32642 118/723 R |
| 7,011,711 | B2 * | 3/2006 | Shreter | C23C 16/455 118/715 |
| 7,273,526 | B2 * | 9/2007 | Shinriki | C23C 16/34 118/715 |
| 7,410,676 | B2 * | 8/2008 | Kim | C23C 16/45514 117/92 |
| 7,452,827 | B2 * | 11/2008 | Gianoulakis | C23C 16/4412 257/E21.161 |
| 7,552,521 | B2 * | 6/2009 | Fink | H01J 37/32623 118/715 |
| 7,601,223 | B2 * | 10/2009 | Lindfors | C23C 16/4412 118/715 |
| 7,666,479 | B2 * | 2/2010 | Strang | C23C 16/45523 118/663 |
| 7,718,030 | B2 * | 5/2010 | Funk | C23C 16/4412 118/715 |
| 7,789,961 | B2 * | 9/2010 | Nelson | C23C 16/45517 118/715 |
| 7,794,546 | B2 * | 9/2010 | Li | C23C 16/4401 118/719 |
| 7,845,309 | B2 * | 12/2010 | Condrashoff | H01J 37/32834 118/723 E |
| 8,038,834 | B2 * | 10/2011 | Funk | C23C 16/4412 118/715 |
| 8,075,728 | B2 * | 12/2011 | Balakrishna | H01J 37/3244 118/715 |
| 8,152,925 | B2 * | 4/2012 | Iizuka | H01J 37/3244 118/715 |
| 8,187,415 | B2 * | 5/2012 | Kim | H01J 37/321 118/723 VE |
| 8,187,679 | B2 * | 5/2012 | Dickey | C23C 16/452 427/569 |
| 8,211,231 | B2 * | 7/2012 | Kerr | C23C 16/45551 118/50 |
| 8,216,419 | B2 * | 7/2012 | Moshtagh | C23C 16/45504 118/715 |
| 8,231,799 | B2 * | 7/2012 | Bera | H01J 37/32082 118/715 |
| 8,236,106 | B2 * | 8/2012 | Iizuka | C23C 16/4412 118/50 |
| 8,277,888 | B2 * | 10/2012 | Dedontney | B01J 19/0046 118/50 |
| 8,282,769 | B2 * | 10/2012 | Iizuka | H01J 37/3244 118/715 |
| 8,313,610 | B2 * | 11/2012 | Dhindsa | H01J 37/32091 156/345.27 |
| 8,366,828 | B2 * | 2/2013 | Iizuka | C23C 16/4412 118/715 |
| 8,528,498 | B2 * | 9/2013 | Benjamin | H01J 37/32366 118/723 E |
| 8,540,844 | B2 * | 9/2013 | Hudson | H01J 37/32082 118/719 |
| 8,545,940 | B2 * | 10/2013 | Choi | C23C 16/45504 427/255.15 |
| 8,747,609 | B2 * | 6/2014 | Iizuka | H01J 37/3244 118/715 |
| 8,852,387 | B2 * | 10/2014 | Iizuka | C23F 1/08 118/715 |
| 8,869,742 | B2 * | 10/2014 | Dhindsa | C23C 16/4412 118/723 E |
| 8,986,495 | B2 * | 3/2015 | Iizuka | H01J 37/32091 118/715 |
| 8,991,331 | B2 * | 3/2015 | Benjamin | H01J 37/32366 118/695 |
| 9,175,393 | B1 * | 11/2015 | Higashi | C23C 16/50 |
| 9,184,028 | B2 * | 11/2015 | Dhindsa | H01J 37/32091 |
| 2001/0004881 | A1 * | 6/2001 | Miller | C03C 17/002 118/729 |
| 2002/0005442 | A1 * | 1/2002 | Watanabe | C23C 16/45565 239/596 |
| 2002/0160125 | A1 * | 10/2002 | Johnson | H01J 37/32082 427/569 |
| 2004/0035532 | A1 * | 2/2004 | Jung | H01J 37/32623 156/345.43 |
| 2004/0067641 | A1 * | 4/2004 | Yudovsky | C23C 16/4412 438/680 |
| 2004/0082251 | A1 * | 4/2004 | Bach | C23C 16/45563 445/60 |
| 2004/0134611 | A1 * | 7/2004 | Kato | C23C 16/455 156/345.33 |
| 2005/0000441 | A1 * | 1/2005 | Kaeppeler | C23C 16/45568 118/723 E |
| 2005/0103265 | A1 * | 5/2005 | Gianoulakis | C23C 16/4412 118/715 |

(56) References Cited

U.S. PATENT DOCUMENTS

| | | | |
|---|---|---|---|
| 2005/0208217 A1* | 9/2005 | Shinriki | C23C 16/34 427/248.1 |
| 2005/0229848 A1* | 10/2005 | Shinriki | C23C 16/34 118/715 |
| 2005/0255257 A1* | 11/2005 | Choi | C23C 16/345 427/585 |
| 2006/0021701 A1* | 2/2006 | Tobe | H01J 37/3244 156/345.31 |
| 2006/0090850 A1 | 5/2006 | Laflamme et al. | |
| 2006/0234514 A1* | 10/2006 | Gianoulakis | C23C 16/4412 438/758 |
| 2007/0026540 A1* | 2/2007 | Nooten | C23C 16/045 438/5 |
| 2007/0062645 A1 | 3/2007 | Fukuchi | |
| 2007/0068625 A1* | 3/2007 | Funk | C23C 16/4412 156/345.29 |
| 2007/0209590 A1* | 9/2007 | Li | C23C 16/4409 118/719 |
| 2008/0035605 A1* | 2/2008 | Takahashi | H01J 37/32844 216/58 |
| 2008/0099426 A1 | 5/2008 | Kumar et al. | |
| 2008/0166880 A1* | 7/2008 | Levy | C23C 16/45525 438/758 |
| 2008/0178805 A1* | 7/2008 | Paterson | H01J 37/32091 118/723 I |
| 2009/0095334 A1* | 4/2009 | Huston | H01J 37/32082 134/105 |
| 2009/0117746 A1* | 5/2009 | Masuda | C23C 16/45561 438/710 |
| 2009/0136665 A1* | 5/2009 | Choi | H01L 21/68792 427/255.7 |
| 2009/0218317 A1 | 9/2009 | Belen et al. | |
| 2009/0229754 A1* | 9/2009 | Iizuka | C23C 16/4412 156/345.34 |
| 2009/0236041 A1* | 9/2009 | Iizuka | C23C 16/4412 156/345.34 |
| 2010/0230052 A1* | 9/2010 | Iizuka | H01J 37/3244 156/345.34 |
| 2011/0061813 A1* | 3/2011 | Iizuka | H01J 37/32834 156/345.34 |
| 2011/0067815 A1* | 3/2011 | Iizuka | H01J 37/3244 156/345.26 |
| 2011/0132542 A1* | 6/2011 | Iizuka | H01J 37/32091 156/345.33 |
| 2011/0214814 A1* | 9/2011 | Iizuka | C23F 1/08 156/345.34 |
| 2011/0284165 A1* | 11/2011 | Iizuka | H01J 37/321 156/345.34 |
| 2012/0024449 A1* | 2/2012 | Ricci | C23C 16/4404 156/60 |
| 2012/0031559 A1* | 2/2012 | Dhindsa | H01J 37/32091 156/345.26 |
| 2012/0034786 A1* | 2/2012 | Dhindsa | C23C 16/4412 438/710 |
| 2014/0023794 A1* | 1/2014 | Mahajani | C23C 16/325 427/535 |
| 2014/0170859 A1* | 6/2014 | Yamawaku | H01L 21/68764 438/778 |
| 2014/0220260 A1* | 8/2014 | Yamawaku | C23C 16/45519 427/569 |
| 2016/0122872 A1* | 5/2016 | Kato | C23C 16/4409 427/8 |

FOREIGN PATENT DOCUMENTS

| | | |
|---|---|---|
| CN | 101540273 A | 9/2009 |
| CN | 101540273 A A | 9/2009 |
| JP | H09291366 A | 11/1997 |
| JP | 2006041539 A | 2/2006 |
| JP | 2007067005 A | 3/2007 |
| JP | 2010512031 A | 4/2010 |
| WO | 2008070181 A2 | 12/2008 |

\* cited by examiner

(Bottom View)

Fig. 3A (Top View)

(Top View)

Fig. 4B (Top View)

Fig. 4C (Top View)

Fig. 4D

Fig. 5

PLASMA PROCESSING CHAMBER WITH DUAL AXIAL GAS INJECTION AND EXHAUST

CLAIM OR PRIORITY

This application is a divisional application of U.S. patent application Ser. No. 12/850,552, filed on Aug. 4, 2010, entitled "Plasma Processing Chamber with Dual Axial Gas Injection and Exhaust." The disclosure of the above-identified patent application is incorporated herein by reference in its entirety.

CROSS-REFERENCE TO RELATED APPLICATIONS

This application is related to U.S. patent application Ser. No. 12/850,559, filed on Aug. 4, 2010, entitled "Dual Plasma Volume Processing Apparatus for Neutral/Ion Flux Control." The disclosure of the above-identified related application is incorporated herein by reference in its entirety.

BACKGROUND OF THE INVENTION

As semiconductor feature sizes continue to get smaller, semiconductor fabrication processes struggle to keep pace. One type of fabrication process involves exposure of a semiconductor wafer to a plasma or other form of reactant gas to either deposit material on the wafer or remove material from the wafer. Smaller feature sizes demand more accurate material deposition and etching control, which in turn requires more accurate control of how the wafer is exposed to the plasma/reactant gas. These more accurate control requirements may include more accurate control of plasma uniformity across the wafer, more accurate control of plasma density across the wafer, and/or more accurate control of plasma residence time in exposure to the wafer, among others. It is in this context that the present invention is created.

SUMMARY OF THE INVENTION

In one embodiment, a semiconductor wafer processing apparatus is disclosed to include an electrode and a gas distribution unit. The electrode is exposed to a plasma generation volume and is defined to transmit radiofrequency (RF) power to the plasma generation volume. The electrode has an upper surface defined to hold a substrate in exposure to the plasma generation volume. The gas distribution unit is disposed above the plasma generation volume and in a substantially parallel orientation with respect to the electrode. The gas distribution unit is defined to include an arrangement of gas supply ports defined to direct an input flow of a plasma process gas into the plasma generation volume in a direction substantially perpendicular to the upper surface of the electrode. The gas distribution unit is further defined to include an arrangement of through-holes that each extend through the gas distribution unit to fluidly connect the plasma generation volume to an exhaust region. Each of the through-holes is defined to direct an exhaust flow of the plasma process gas from the plasma generation volume in a direction substantially perpendicular to the upper surface of the electrode.

In another embodiment, a system for semiconductor wafer processing is disclosed. The system includes a chamber defined to have an interior cavity. The system also includes a chuck disposed within the interior cavity of the chamber. The chuck has an upper surface defined to hold a substrate in exposure to a plasma generation volume. And, the chuck is defined to supply RF power to the plasma generation volume. The system also includes an outer peripheral structure disposed on the chuck and defined to surround and enclose a perimeter of the plasma generation volume. The system further includes a gas distribution unit disposed on the outer peripheral structure and defined to extend across the plasma generation volume in a substantially parallel relationship to the upper surface of the chuck. The gas distribution unit is defined to include an arrangement of gas supply ports defined to direct an input flow of a plasma process gas into the plasma generation volume. The gas distribution unit is further defined to include an arrangement of through-holes. The system also includes an exhaust region defined within the chamber above the gas distribution unit, such that each of the through-holes extends through the gas distribution unit to fluidly connect the plasma generation volume to the exhaust region. The system also includes a pump fluidly connected to the exhaust region to remove gases from the exhaust region.

In another embodiment, a method is disclosed for semiconductor wafer processing. The method includes an operation for holding a semiconductor wafer in a substantially parallel orientation to a gas distribution unit, such that a plasma processing volume is formed between the semiconductor wafer and the gas distribution unit. The method also includes an operation for flowing a plasma processing gas from within the gas distribution unit into the plasma processing volume in a direction substantially perpendicular to the semiconductor wafer. The method further includes an operation for directing an exhaust flow of plasma processing gas from within the plasma processing volume through the gas distribution unit in a direction substantially perpendicular to the semiconductor wafer, whereby the exhaust flow of plasma processing gas through the gas distribution unit is the only exhaust flow of plasma processing gas from within the plasma processing volume.

Other aspects and advantages of the invention will become more apparent from the following detailed description, taken in conjunction with the accompanying drawings, illustrating by way of example the present invention.

DETAILED DESCRIPTION

In the following description, numerous specific details are set forth in order to provide a thorough understanding of the present invention. It will be apparent, however, to one skilled in the art that the present invention may be practiced without some or all of these specific details. In other instances, well known process operations have not been described in detail in order not to unnecessarily obscure the present invention.

A semiconductor wafer processing apparatus is disclosed herein to enable precise control of plasma residence time and uniformity across a wafer to enable wafer fabrication processes that require rapid and uniform process gas injection and pump out. Examples of such wafer fabrication processes that require rapid and uniform process gas injection and pump out include, but are not limited to, atomic layer etching and atomic layer deposition.

The apparatus includes a gas distribution unit disposed above the plasma generation region, with the wafer held on an electrostatic chuck below and in exposure to the plasma generation region. The gas distribution unit is defined to supply the plasma process gas downward toward the wafer in a substantially uniform manner. The gas distribution unit is also defined to exhaust plasma process gas upward from the wafer in a substantially uniform manner. Thus, as described in more detail below, the gas distribution unit provides for both axial gas injection and exhaust.

Figure 1A:
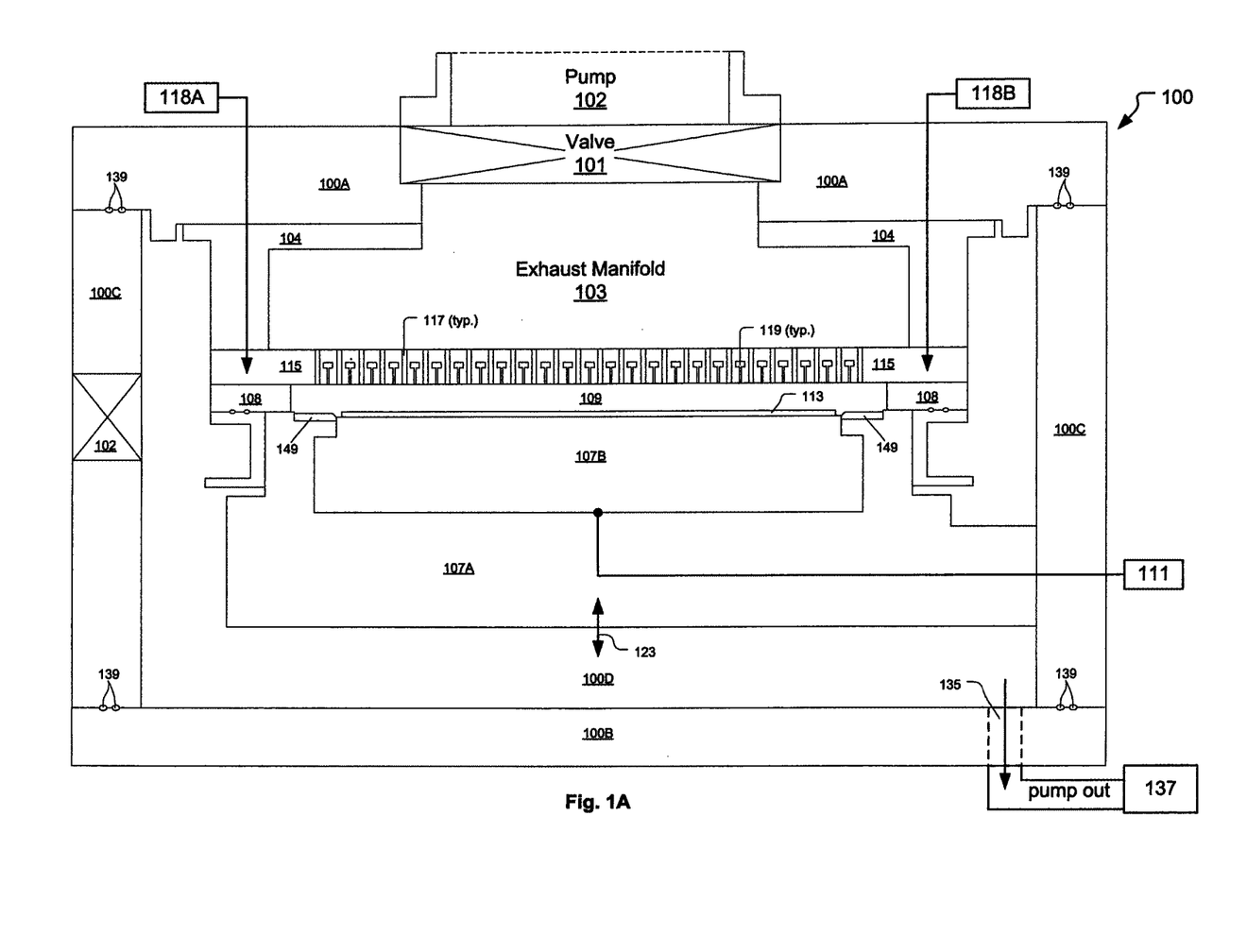
FIG. 1A shows a semiconductor wafer processing apparatus, in accordance with one embodiment of the present invention.

FIG. 1A shows a semiconductor wafer processing apparatus, in accordance with one embodiment of the present invention. The apparatus includes a chamber 100 formed by a top plate 100A, a bottom plate 100B, and walls 100C. In one embodiment, the walls 100C form a contiguous cylindrical shaped wall 100C. In other embodiments, the walls 100C can have other configurations, so long as an interior cavity 100D of the chamber 100 can be isolated from an external environment outside the chamber 100. A number of seals 139 are disposed between the chamber top plate 100A, bottom plate 100B, and walls 100C to facilitate isolation of the interior cavity 100D of the chamber 100 from the external environment.

In various embodiments, the top plate 100A, bottom plate 100B, and walls 100C of the chamber 100 can be formed of a metal that is a good conductor of electricity and heat, and that is chemically compatible with the process gases to which the interior cavity 100D is to be exposed during wafer processing. For example, in various embodiments, metals such as aluminum, stainless steel, or the like, maybe used to form the chamber 100 components. Also, the seals 139 can be elastomeric seals or consumable metallic seals, or any other type of seal material, so long as the seals 139 are chemically compatible with processing materials to which the interior cavity 100D will be exposed, and so long as the seals 139 provide sufficient isolation of the interior cavity 100D from the external environment outside the chamber 100.

It should be appreciated that in other embodiments, one or more additional plates or members can be disposed outside any one or more of the top plate 100A, bottom plate 100B, or walls 100C, as necessary to satisfy chamber 100 deployment-specific conditions or other considerations. Additionally, the top plate 100A, bottom plate 100B, and/or walls 100C can be fastened to these additional plates or members as appropriate for the particular implementation. The chamber 100 structure, including the top plate 100A, bottom plate 100B and walls 100C, is formed of an electrically conducting material and is electrically connected to a reference ground potential.

The chamber 100 includes an exhaust port 135 which provides for fluid connection of the interior cavity 100D to an external exhaust pump 137, such that a negative pressure can be applied through the exhaust port 135 to remove gases and/or particulates from within the interior cavity 100D. In one embodiment, the chamber 100 also includes a gate valve 102 formed within a section of the chamber wall 100C to enable insertion of a wafer 113 into the interior cavity 100D, and corresponding removal of the wafer 113 from the interior cavity 100D. In its closed position, the gate valve 102 is defined to maintain isolation of the interior cavity 100D from the external environment. In various embodiments, the exhaust pump 137 can be implemented in different ways, so long as the exhaust pump 137 is capable of applying a suction at the exhaust port 135 to draw a fluid flow from the interior cavity 100D of the chamber 100.

A plasma processing apparatus is disposed within the interior cavity 100D of the chamber 100. The plasma processing apparatus includes a plasma generation volume 109 formed between a chuck 107A/B and a gas distribution unit 115. More specifically, the plasma generation volume 109 resides above the chuck 107A/B and below the gas distribution unit 115, with an upper surface of the chuck 107A/B and a lower surface of the gas distribution unit 115 disposed in a substantially parallel orientation with respect to each other. A peripheral structural member 108 is also disposed to enclose a perimeter of the plasma generation volume 109 between the gas distribution unit 115 and the upper surface of the chuck 107A/B.

As mentioned above, the chuck 107A/B is disposed within the interior cavity 100D of the chamber 100 below the plasma generation volume 109. The chuck 107A/B includes a body portion 107A and an electrode portion 107B In one embodiment, the chuck body 107A is cantilevered from the wall 100C of the chamber 100. In one embodiment, the chuck 107A/B is an electrostatic chuck with the electrode 107B defined to transmit RF power to the plasma generation volume 109. An upper surface of the electrode portion of the chuck 107B is defined to hold a substrate 113, i.e., wafer 113, in exposure to the plasma generation volume 109. In one embodiment, a quartz focus ring 149 is disposed on the body of the chuck 107A about the periphery of a substrate 113 receiving/holding area on the chuck 107B. The chuck 107 is also defined to include a configuration of cooling channels and/or heating elements, so as to enable temperature control of the substrate 113 and the plasma generation volume 109.

The chuck 107A/B is defined to move vertically within the interior cavity 100D, as indicated by arrows 123. In this manner, the chuck 107A/B can be lowered to receive/ provide the substrate 113 through the gate valve 102, and can be raised to form the lower surface of the plasma generation volume 109. Also, a vertical distance across the plasma generation volume 109, as measured perpendicular to both the chuck 107B and the gas distribution unit 115, can be set and controlled by controlling the vertical position of the chuck 107B. The vertical distance across the plasma generation volume 109 can be set to achieve a sufficient center-to-edge plasma uniformity and density, and can also be set to avoid printing on the wafer 113 by jets of gas flowing from gas supply ports 119 of the gas distribution unit 115. In various embodiments, the vertical distance across the plasma generation volume 109 can be set within a range extending from about 1 cm to about 5 cm. In one embodiment, the vertical distance across the plasma generation volume 109 is set at about 2 cm. It should be appreciated that the vertical distance across the plasma generation volume 109 is controlled to enable rapid evacuation of the plasma generation volume 109, and thereby enable accurate control of plasma residence time within the plasma generation volume 109.

The electrode portion of the chuck 107B is defined to supply RF power from an RF power source 111 to the plasma generation volume 109. It should be understood that the RF power source 111 is connected through a matching network to enable transmission of the RF power to the electrode portion of the chuck 107B. As previously discussed, in one embodiment, the gas distribution unit 115 is electrically connected to a reference ground potential, such that the gas distribution unit 115 serves as a reference ground electrode in the RF power return path for the plasma generation volumes 109.

The gas distribution unit 115 is held in a fixed position above the plasma generation volume 109 and the peripheral structural member 108. The gas distribution unit 115 is defined to supply a plasma process gas to the plasma generation volume 109 through an arrangement of gas supply ports 119. The gas distribution unit 115 is further defined to include an arrangement of through-holes 117 to provide for fluid exhaust from the plasma generation volume 109. Each of the through-holes 117 extends through the gas distribution unit 115 plate from its upper surface to its lower surface.

Figure 1B:
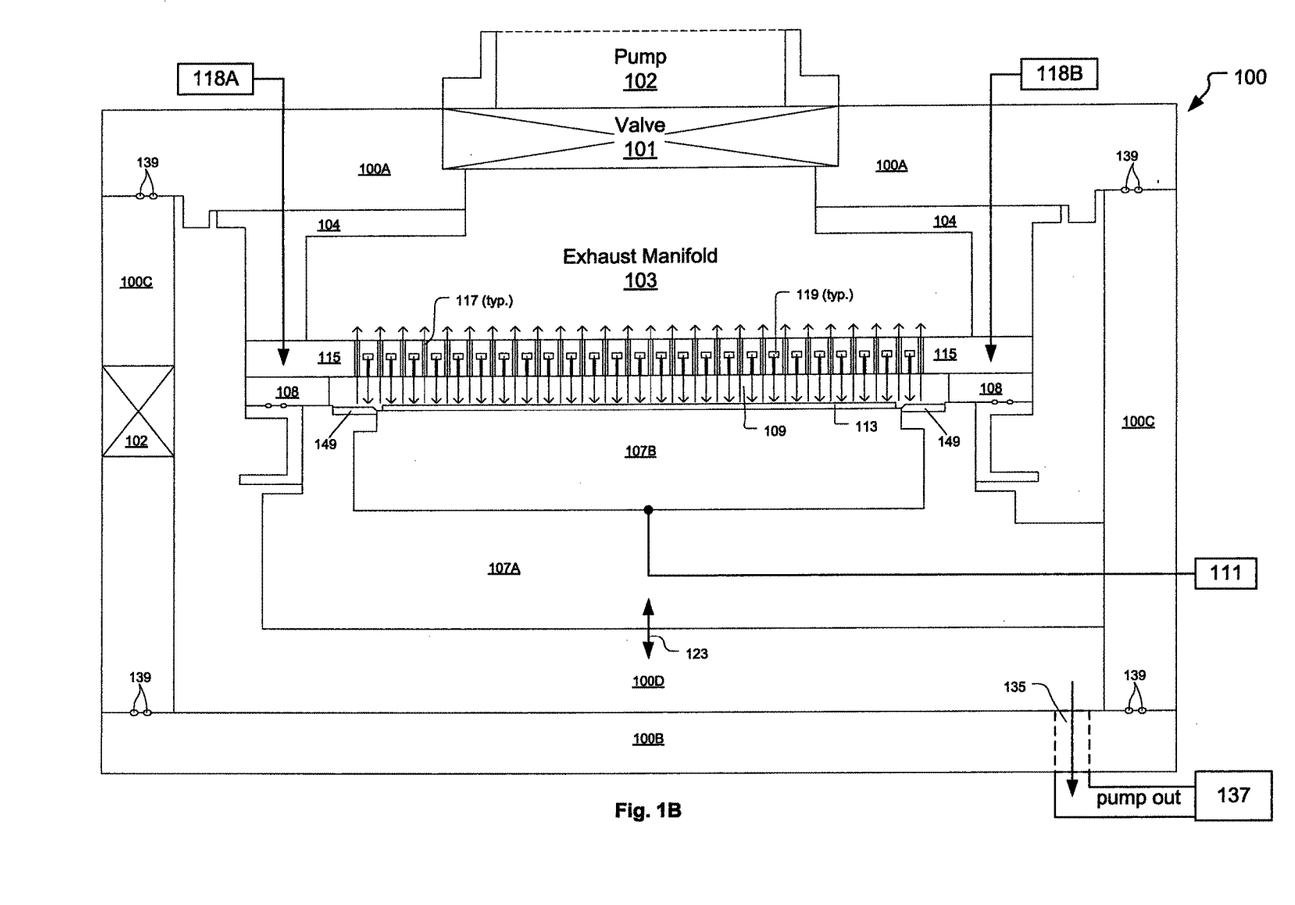
FIG. 1B shows the chamber of FIG. 1A with arrows depicting gas flow and exhaust flow through the gas distribution unit, in accordance with one embodiment of the present invention.

FIG. 1B shows the chamber 100 of FIG. 1A with arrows depicting gas flow and exhaust flow through the gas distribution unit 115, in accordance with one embodiment of the present invention. As shown in FIGS. 1A and 1B, plasma process gas is supplied to the gas distribution unit 115 from one or more plasma process gas supply sources 118A/118B. The plasma process gas flows through the gas distribution unit 115 and out of the gas supply ports 119 into the plasma generation volume 109. The plasma process gas is exhausted from the plasma generation volume 109 through the through-holes 117 of the gas distribution unit 115 into a exhaust manifold 103. In the embodiment of FIGS. 1A and 1B, the plasma generation volume 109 is sealed such that plasma process gas is only exhausted through the through-holes 117 of the gas distribution unit 115 into the exhaust manifold 103.

In one embodiment, the exhaust manifold 103 is connected to a vacuum pump 102, by way of a valve 101. The valve 101 can be operated to fluidly connect/disconnect the exhaust manifold 103 to/from the pump 102, thereby enabling the pressure within the exhaust manifold 103 to be released to the pump 102, such that plasma process gas within the higher pressure plasma generation volume 109 will flow through the through-holes 117 of the gas distribution unit 115, into the lower pressure exhaust manifold 103, through the valve 101, to the pump 102, so as to exhaust the plasma process gas from the plasma generation volume 109.

Figure 2:
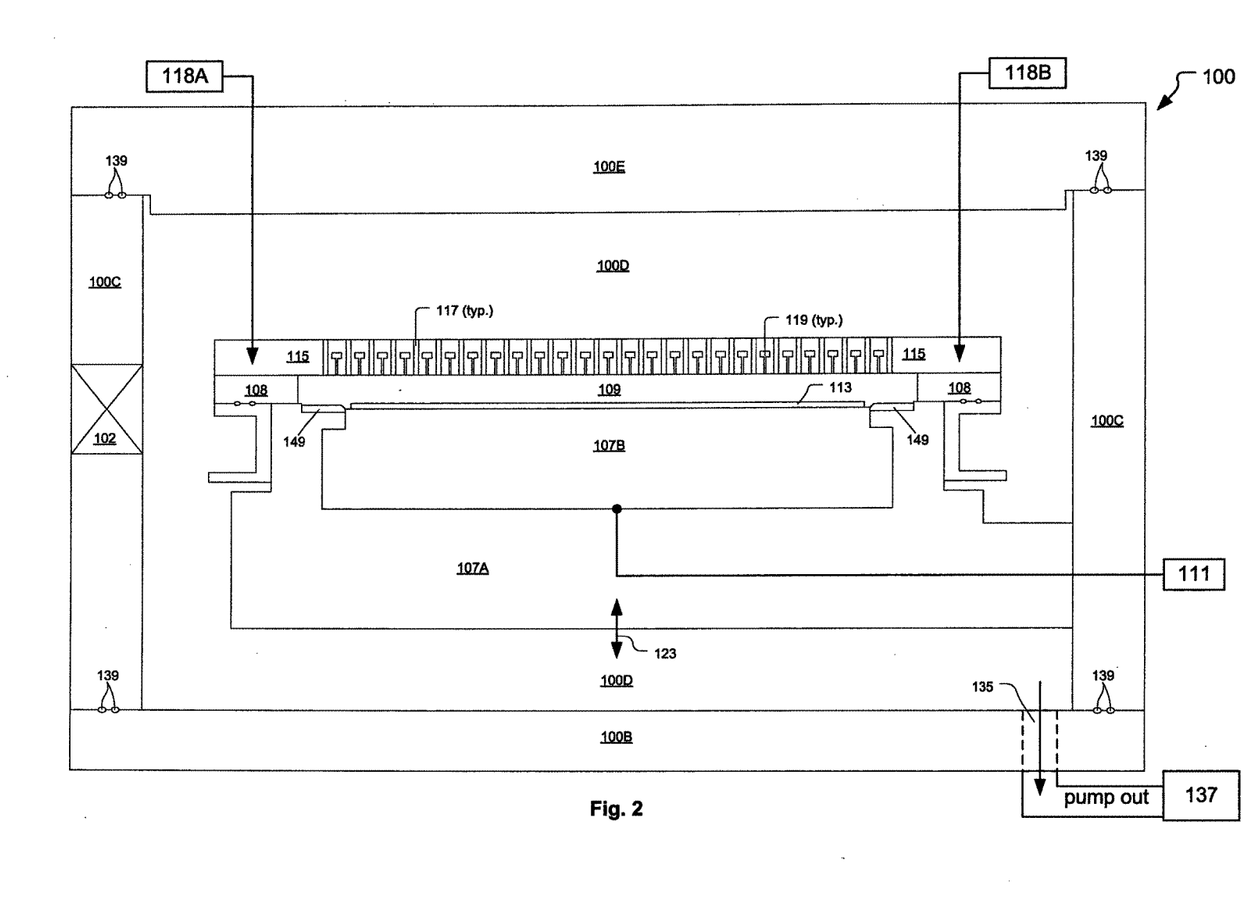
FIG. 2 shows an alternative configuration of the chamber of FIG. 1A, in accordance with one embodiment of the present invention.

FIG. 2 shows an alternative configuration of the chamber 100, in accordance with one embodiment of the present invention. In this embodiment, the through-holes 117 of the gas distribution unit 115 are in fluid communication with the interior cavity 100D of the chamber 100. In this embodiment, plasma process gas is exhausted from the plasma generation volume 109 through the through-holes 117 of the gas distribution unit 115 directly into the interior cavity 100D of the chamber 100. The plasma process gas within the interior cavity 100D of the chamber is removed through the exhaust port 135, by way of the pump 137. In this embodiment, the interior cavity 100D of the chamber 100 serves as the exhaust manifold. Thus, the outer structural member 104 of the embodiment of FIGS. 1A and 1B is removed. And, the top plate 100A is replaced by a top plate 100E that does not include the valve 101 and the connection to the pump 102. In this embodiment, the pressure within the interior cavity 100D of the chamber 100 can be controlled relative to the pressure within the plasma generation volume 109 to in turn control the plasma process gas exhaust flow rate through the through-holes 117 of the gas distribution unit 115.

It should be appreciated that the dual axial plasma process gas input and exhaust provided by the gas distribution unit 115 enables plasma processing of the wafer 113 with substantially uniform center-to-edge plasma density over the wafer 113. More specifically, the dual axial plasma process gas input and exhaust provided by the gas distribution unit 115 prevents radial plasma process gas flows within the plasma generation volume 109, which could cause radial non-uniformity in the center-to-edge plasma density profile. Also, the dual axial plasma process gas input and exhaust provided by the gas distribution unit 115 enables plasma processing of the wafer 113 with substantially short plasma residence time on the wafer 113, when necessary.

Figure 3A:
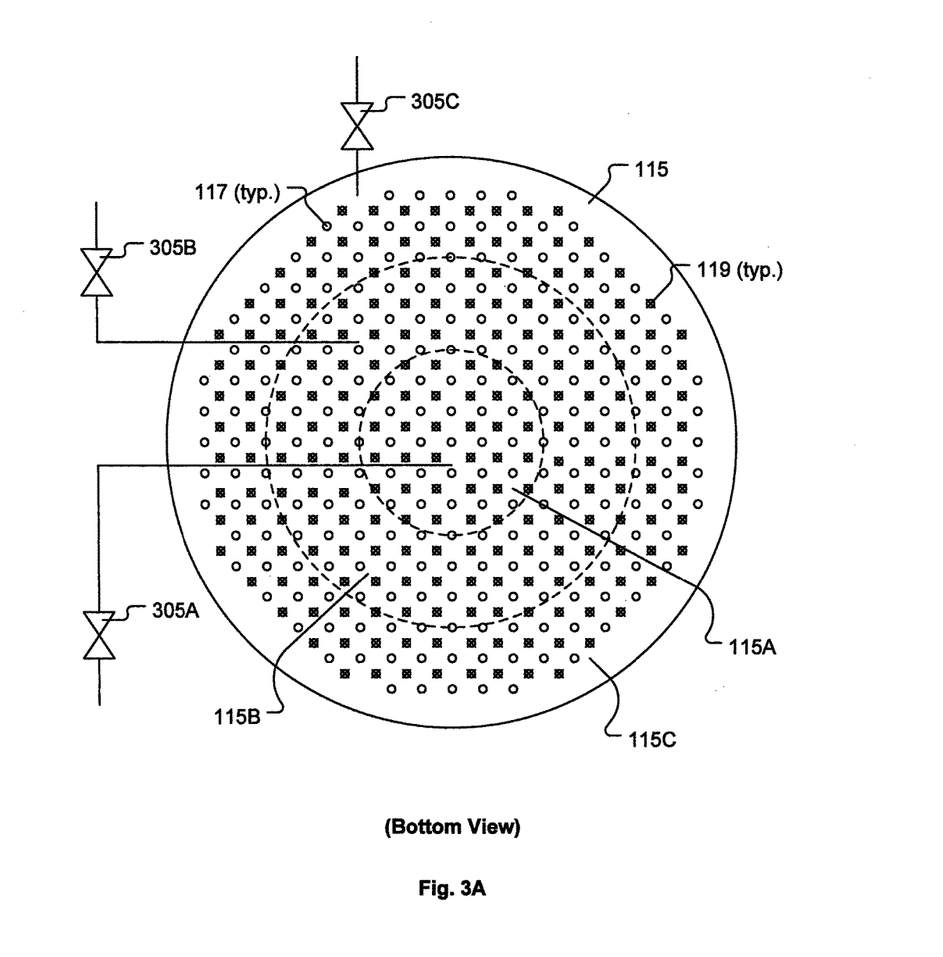
FIG. 3A shows a bottom view of the gas distribution unit, in accordance with one embodiment of the present invention.

FIG. 3A shows a bottom view of the gas distribution unit 115, in accordance with one embodiment of the present invention. Each of the gas supply ports 119 and through-holes 117 are defined in open fluid communication through the lower surface of the gas distribution unit 115. The arrangement of gas supply ports 119 is interspersed between the arrangement of through-holes 117. The gas supply ports 119 are plumbed through the gas distribution unit 115 to one or more plasma process gas supply sources 118A/B, such that no direct fluid communication exists between the gas supply ports 119 and the through-holes 117 within the gas distribution unit 115.

Figure 3B:
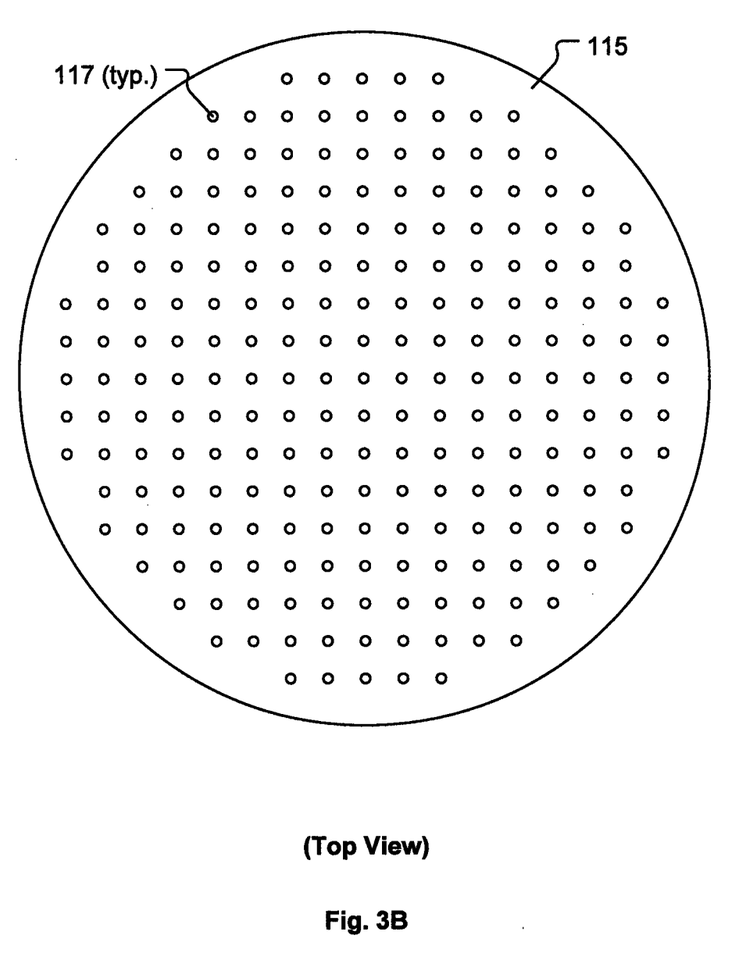
FIG. 3B shows a top view of the gas distribution unit, in accordance with one embodiment of the present invention.

FIG. 3B shows a top view of the gas distribution unit 115, in accordance with one embodiment of the present invention. Each of the through-holes 117 is defined in open fluid communication through the upper surface of the gas distribution unit 115. However, the gas supply ports 119 are not fluidly exposed through the upper surface of the gas distribution unit 115. Therefore, the gas supply ports 119 are defined to flow plasma process gas into only the plasma generation volume 109. In contrast, the through-holes 117 are defined to enable fluid communication from the plasma generation volume 109 to the exhaust manifold 103 (or to the interior cavity 100D in the embodiment of FIG. 2). Fluid flow through the through-holes 117 of the gas distribution unit 115 is controlled primarily by a pressure differential between the plasma generation volume 109 and the exhaust manifold 103 (or the interior cavity 100D in the embodiment of FIG. 2).

It should be understood that the gas distribution unit 115 serves as a RF return path electrode, plasma process gas manifold, and fluid flow baffle plate. In various embodiments the gas distribution unit 115 can be formed of metal that is a good conductor of electricity and heat, and that is chemically compatible with the processes to be conducted in the plasma generation volume 109, such as aluminum, stainless steel, or the like. In various embodiments, the gas distribution unit 115 can be electrically connected to either a reference ground potential or a bias voltage to enable the RF return path electrode function of the gas distribution unit 115. Thus, the gas distribution unit 115 provides a ground electrode for the plasma generation volume 109. In one embodiment, the electrode 107B and the gas distribution unit 115 form an approximate one-to-one power-to-ground surface area. The configuration of the gas distribution unit 115 relative to the electrode 107B enables formation of a capacitively coupled plasma within the plasma generation volume 109.

In one embodiment, portions of the gas distribution unit 115 that are exposed to plasma are protected by a covering of plasma resistant material. In one embodiment, the plasma resistant material is formed as a coating. In another embodiment, the plasma resistant material is formed as a protective structure, e.g., plate, that conformally covers the gas distribution unit 115. In either of these embodiments, the plasma resistant material is secured to the gas distribution unit 115 to ensure adequate electrical and thermal conduction between the plasma resistant material and the gas distribution unit 115. In the embodiment of the plasma resistant protective structure, the protective structure may be secured to the gas distribution unit 115 by a number of fasteners, or by compression between the gas distribution unit 115 and the outer peripheral structure 108 when disposed beneath the gas distribution unit 115. In various embodiments, the plasma resistant coating/protective structure used to protect the gas distribution unit 115 can be formed of silicone, silicon carbide, silicon oxide, yttrium oxide, or essentially any other material that provides adequate plasma resistance, electrical conduction, and thermal conduction for the plasma processes to which it is exposed.

The gas distribution unit 115 is defined as a swappable component. Different versions/configurations of the gas distribution unit 115 can be defined to have different arrangements of the gas supply ports 119 and through-holes 117. Additionally, in the event that plasma deteriorates the gas distribution unit 115 or its functionality, the gas distribution unit 115 can be replaced.

Each of the gas supply ports 119 and through-holes 117 is defined to optimize fluid flow through it, while simultaneously preventing adverse intrusion of plasma into it. Fluid flow and plasma intrusion through/into each of the gas supply ports 119 and though-holes 117 is directly proportional to its size. Therefore, it is necessary to define each of the gas supply ports 119 and though-holes 117 such that its size is small enough to prevent adverse plasma intrusion into it, while remaining large enough to provide adequate fluid flow through it. In various embodiments, the diameter of the gas supply ports 119 is sized within a range extending from about 0.1 mm to about 3 mm. In various embodiments, the diameter of the through-holes 117 is sized within a range extending from about 0.5 mm to about 5 mm. It should be understood, however, that in various embodiments the gas supply ports 119 and through-holes 117 can be respectively defined with essentially any diameter size, so long as the diameter size provides for adequate fluid flow there through while simultaneously providing for adequate suppression of plasma intrusion therein.

Figure 3C:
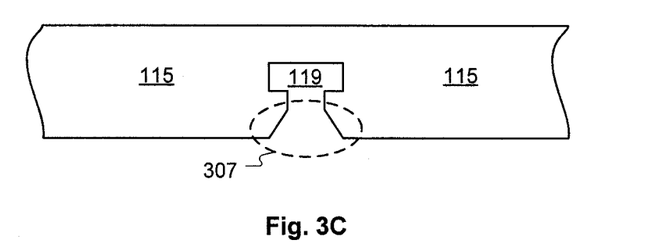
FIG. 3C shows a gas supply port cross-section, in accordance with one embodiment of the present invention.

Because the fluid flow pressure to the gas supply ports 119 is directly controllable, it is possible to define the gas supply ports 119 to have a small enough size to essentially prevent plasma intrusion into the gas supply ports 119. However, it is appropriate to avoid defining the gas supply ports 119 so small as to cause supersonic fluid flow through the gas supply ports 119. To avoid supersonic fluid flow from the gas supply ports 119, the gas supply ports 119 can be defined to have a diffuser shape at their exit from the lower surface of the gas distribution unit 115. FIG. 3C shows a gas supply port 119 cross-section, in accordance with one embodiment of the present invention. The gas supply port 119 is shown to have a diffuser shape 307 at its exit location from the gas distribution unit 115.

The gas distribution unit 115 includes interior gas supply channels fluidly connected to the arrangement of gas supply ports 119. These interior gas supply channels are fluidly connected to one or more plasma process gas supply sources 118A/B. Although the embodiments of FIGS. 1A, 1B, and 2 show two plasma process gas supply sources 118A/B for ease of description, it should be understood that essentially any number of plasma process gas supply sources 118A/B/C/D, etc., can be connected to supply plasma process gas to the gas distribution unit 115, depending on the specific configuration of the gas distribution unit 115 and chamber 100. Also, it should be understood that the interior gas supply channels and associated gas supply ports 119 are defined between the arrangement of through-holes 117 such that the plasma process gas is distributed to the plasma generation volume 109 before entering the through-holes 117.

In one embodiment, such as depicted in FIG. 3A, the interior gas supply channels within the gas distribution unit 115 are defined to fluidly separate the arrangement of gas supply ports 119 into multiple concentric regions/zones 115A, 115B, 115C across the lower surface of the gas distribution unit 115, such that flow rates of the plasma process gas to the gas supply ports 119 within each of the multiple concentric regions/zones 115A, 115B, 115C can be separately controlled. In one embodiment, the gas supply ports 119 within each concentric radial region/zone 115A, 115B, 115C are plumbed to a respective gas flow control device 305A, 305B, 305C, such that supply of the plasma process gas to each concentric radial region/zone 115A, 115B, 115C is independently controllable.

Separation of the gas supply ports 119 into independently controllable multiple concentric regions/zones 115A, 115B, 115C provides for center-to-edge gas supply control within the plasma generation volume 109, which in turn improves center-to-edge plasma uniformity control within the plasma generation volume 109. Although the example embodiment of FIG. 3A shows three concentric gas supply regions/zones 115A, 115B, 115C, it should be understood that the gas distribution unit 115 can be defined to include more or less independently controllable gas supply regions/zones. For example, in another embodiment, the gas distribution unit 115 is defined to include two independently controllable concentric gas supply regions/zones.

In one embodiment, the number of through-holes 117 is greater than the number gas supply ports 119, to provide for adequate fluid exhaust flow from the plasma generation volume 109. Also, the through-holes 117 can be defined to have a larger size than the gas supply ports 119, to provide for adequate fluid exhaust flow from the plasma generation volume 109. However, as previously discussed, the size of the through-holes 117 is limited to prevent adverse plasma intrusion from the plasma generation volume 109 into the through-holes 117.

Figure 4A:
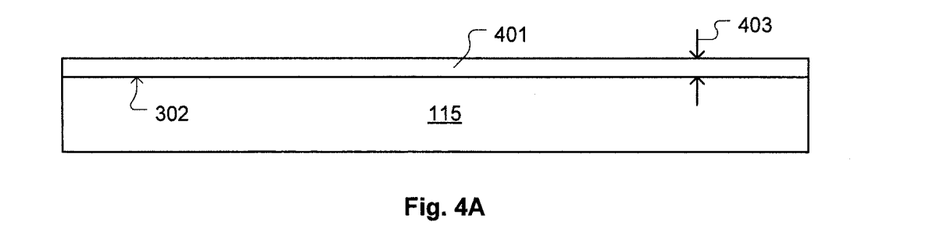
FIG. 4A shows a flow control plate disposed on the upper surface of the gas distribution unit, in accordance with one embodiment of the present invention.

In one embodiment, a flow control plate is disposed on the upper surface of the gas distribution unit 115 to control which through-holes 117 are open for fluid exhaust from the plasma generation volume 109. FIG. 4A shows a flow control plate 401 disposed on the upper surface 302 of the gas distribution unit 115, in accordance with one embodiment of the present invention. In one embodiment, the flow control plate 401 is defined as a disc having a thickness 403 within a range extending from about 3 mm to about 6 mm. The flow control plate 401 disc is defined to have a diameter sufficient to cover the through-holes 117 through which flow is to be controlled. In one embodiment, the flow control plate 401 disc is defined to have a diameter that covers the upper surface of the gas distribution unit 115.

In one embodiment, the flow control plate 401 is formed of an electrically and thermally conductive material, and is secured to the gas distribution unit 115 to ensure adequate electrical and thermal conduction between the flow control plate 401 and the gas distribution unit 115. In one embodiment, the flow control plate 401 is secured to the gas distribution unit 115 by a number of fasteners. Also, in various embodiments, the flow control plate 401 can be covered and protected by a plasma resistant coating such as that discussed above with regard to the gas distribution unit 115.

In one embodiment, multiple patterns of holes are defined through the flow control plate 401. Each of the multiple patterns of holes within the flow control plate 401 aligns with a different set of through-holes 117 within the gas distribution unit 115. Disposal of the flow control plate 401 on the upper surface of the gas distribution unit 115 at a particular rotational position of the flow control plate 401 relative to the upper surface of the gas distribution unit 115 corresponds to alignment of a particular one of the multiple patterns of holes within the flow control plate 401 with its corresponding set of through-holes 117 within the gas distribution unit 115. Each of the multiple patterns of holes that extends through the flow control plate 401 is defined to expose a different number or a different spatial pattern of through-holes 117 within the gas distribution unit 115. Therefore, fluid exhaust through the gas distribution unit 115 can be controlled by setting the flow control plate 401 at a particular rotational position relative to the upper surface of the gas distribution unit 115.

Figure 4B:
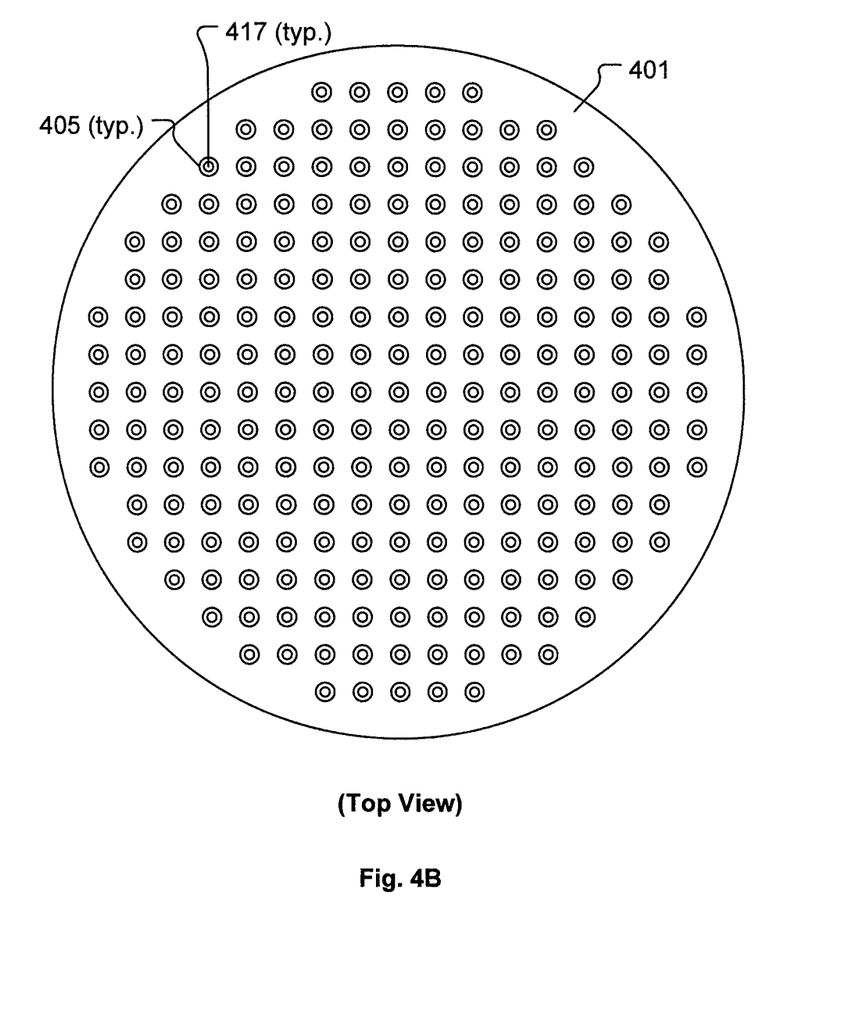
FIG. 4B shows a top view of the flow control plate positioned such that a hole pattern defined therein allows for flow through all through-holes defined within the underlying gas distribution unit, in accordance with one embodiment of the present invention.
Figure 4C:
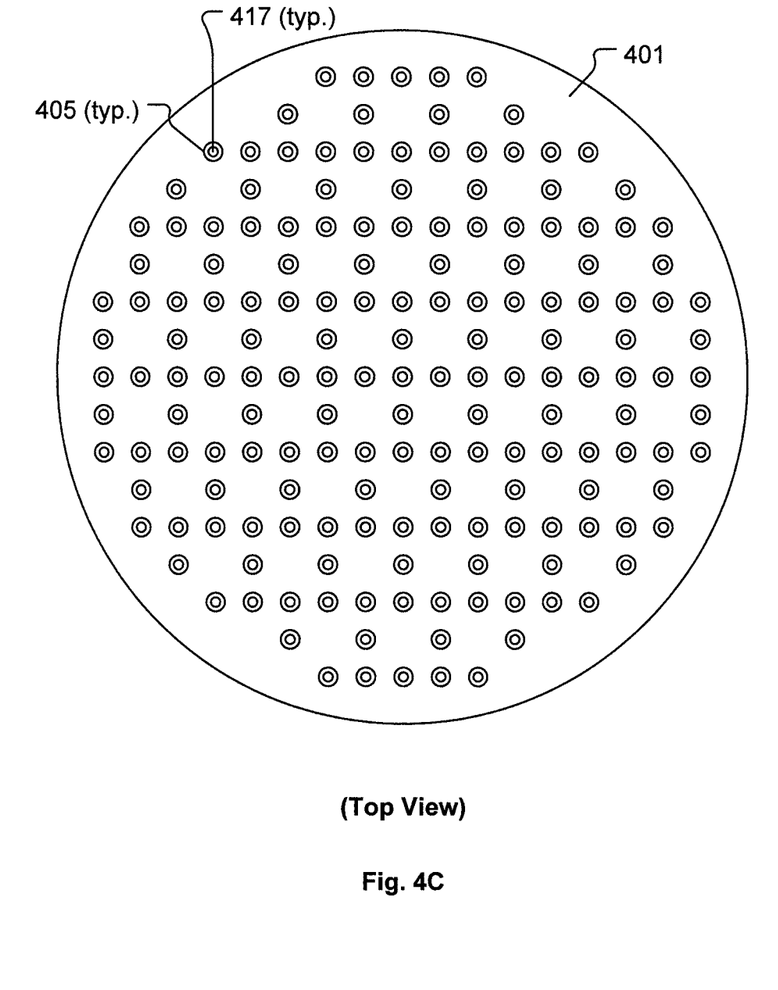
FIG. 4C shows a top view of the flow control plate positioned such that the hole pattern defined therein allows for flow through only a portion of the through-holes defined within the underlying gas distribution unit, in accordance with one embodiment of the present invention.

FIG. 4B shows a top view of the flow control plate 401 positioned such that a hole 405 pattern defined therein allows for flow through all through-holes 117 defined within the underlying gas distribution unit 115, in accordance with one embodiment of the present invention. FIG. 4C shows a top view of the flow control plate 401 positioned such that the hole 405 pattern defined therein allows for flow through only a portion of the through-holes 117 defined within the underlying gas distribution unit 115, in accordance with one embodiment of the present invention. Also, in other embodiments, the multiple patterns of holes 405 in the flow control plate 401 are defined to provide for different spatial patterns of fluid exhaust flow through the gas distribution unit 115.

Figure 4D:
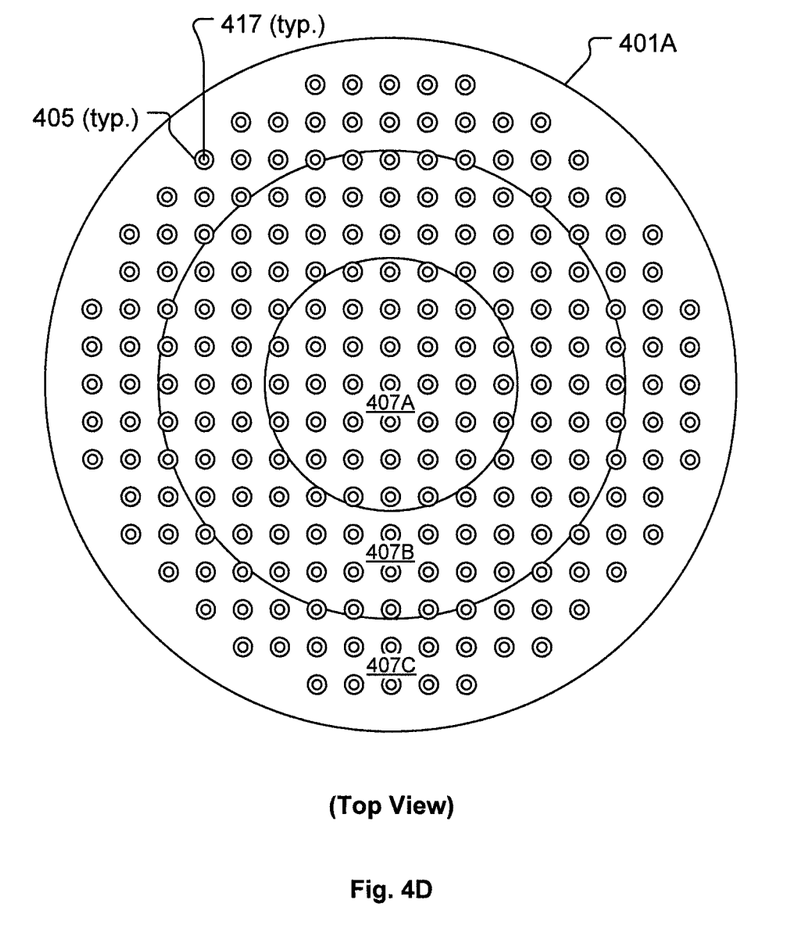
FIG. 4D shows a top view of a flow control plate assembly defined by a number of concentric rotatable flow control plates, in accordance with one embodiment of the present invention.

FIG. 4D shows a top view of a flow control plate assembly 401A defined by a number of concentric rotatable flow control plates 407A, 407B, 407C, in accordance with one embodiment of the present invention. Each concentric rotatable flow control plate 407A, 407B, 407C can be set independently to provide center-to-edge control over which through-holes 117 are open or closed within the gas distribution unit 117. Specifically, the flow control plate assembly 401A includes a central disc 407A and a number of concentric rings 407B/407C, disposed in a concentric manner on the upper surface of the gas distribution unit 115. It should be understood that the particular configuration of FIG. 4D is provided by way of example. Other embodiments may include a different number of concentric rotatable flow control plates than what is shown in FIG. 4D.

Each of the central disc 407A and the number of concentric rings 407B/407C respectively include multiple patterns of holes extending there through. Each of the multiple patterns of holes aligns with a different set of through-holes 117 within the gas distribution unit 115, such that disposal of each of the central disc 407A and the concentric rings 407B/407C on the upper surface of the gas distribution unit 115, at a particular rotational position relative to the upper surface of the gas distribution unit 115, corresponds to alignment of a particular one of the multiple patterns of holes with its corresponding set of through-holes 117 within the gas distribution unit 115. Each of the multiple patterns of holes extending through the central disc 407A and the concentric rings 407B/407C is defined to expose a different number or a different spatial pattern of through-holes 117 within the gas distribution unit 115.

It should be understood that plasma generation volume 109 is sized to contain a confined plasma. A confined plasma is beneficial in that its residence time can be controlled by controlling volume, pressure, and flow within the plasma region, i.e., within the plasma generation volume 109. Plasma residence time affects the dissociation process, which is a factor in radical/neutron formation. Also, plasma residence time affects an amount of deposition or etching that occurs on the wafer 113, which is an important factor in performing short residence time processes such as atomic layer deposition or atomic layer etching. The plasma generation volume 109 is small and well-controlled with regard to pressure and temperature. In various embodiments, a pressure within the lower plasma processing volume 109 can be controlled within a range extending from about 5 mTorr to about 100 mTorr, or from about 10 mTorr to about 30 mTorr, or from about 100 mTorr to about 1 Torr, or from about 200 mTorr to about 600 mTorr.

It should be appreciated that the dual axial plasma process gas input and exhaust provided by the gas distribution unit 115 enables accurate pressure uniformity control across the wafer 113, because gases are pumped out vertically as opposed to radially, which would cause a radial pressure distribution across wafer 113. The dual axial plasma process gas input and exhaust also allows for accurate control of residence time in low flow applications, such as atomic layer deposition or atomic layer etching in which short plasma residence time, e.g., less than a millisecond, is required.

Figure 5:
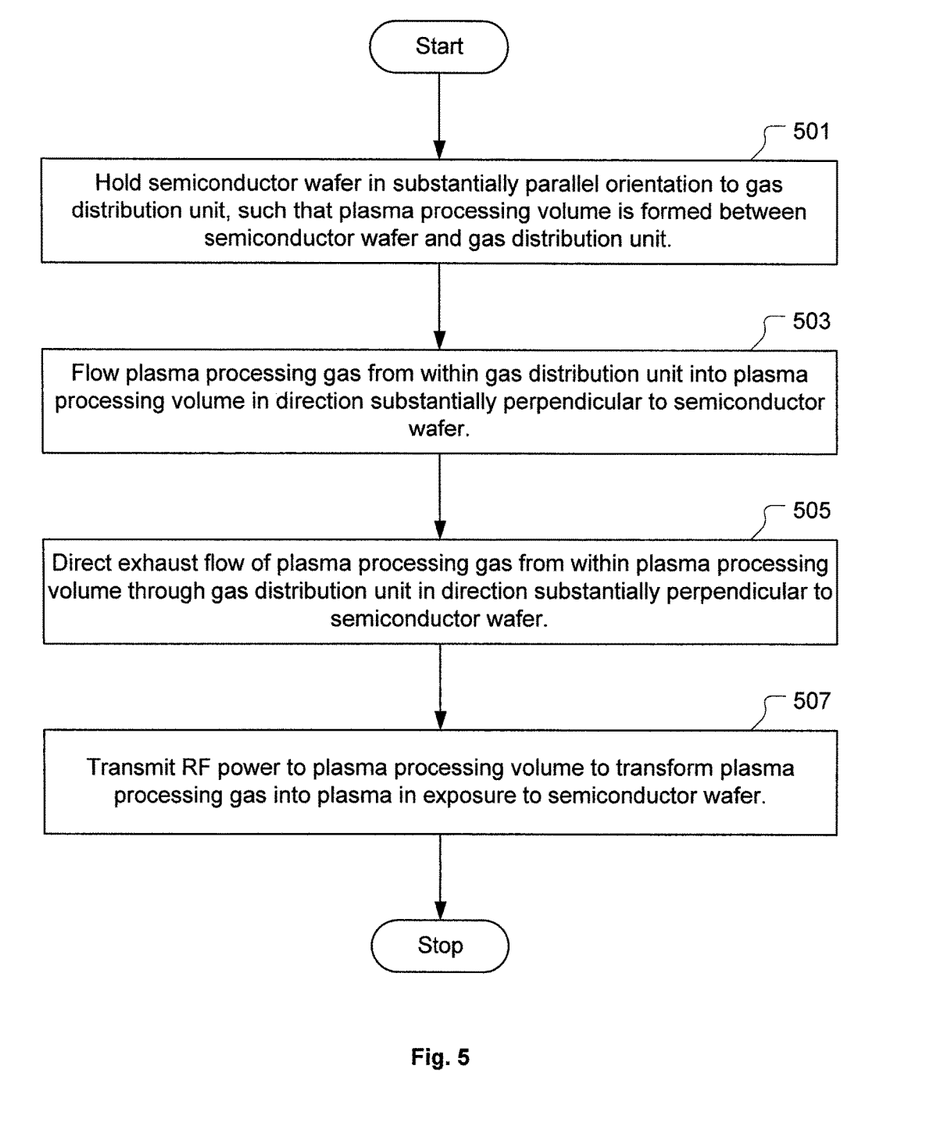
FIG. 5 shows a flowchart of a method for semiconductor wafer processing, in accordance with one embodiment of the present invention.

FIG. 5 shows a flowchart of a method for semiconductor wafer processing, in accordance with one embodiment of the present invention. The method includes an operation 501 for holding a semiconductor wafer in a substantially parallel orientation to a gas distribution unit, such that a plasma processing volume is formed between the semiconductor wafer and the gas distribution unit. In one embodiment, the gas distribution unit is defined as a plate that extends over an entirety of the plasma processing volume. Also, in one embodiment, the semiconductor wafer is held on an upper surface of a chuck. The method also includes an operation 503 for flowing a plasma processing gas from within the gas distribution unit into the plasma processing volume in a direction substantially perpendicular to the semiconductor wafer. Additionally, an operation 505 is performed to direct an exhaust flow of plasma processing gas from within the plasma processing volume through the gas distribution unit in a direction substantially perpendicular to the semiconductor wafer. The exhaust flow of plasma processing gas through the gas distribution unit is the only exhaust flow of plasma processing gas from within the plasma processing volume.

The method further includes an operation 507 for transmitting RF power to the plasma processing volume to transform the plasma processing gas into a plasma in exposure to the semiconductor wafer. In one embodiment, the chuck that holds the semiconductor wafer is operated as an electrode to transmit the RF power to the plasma processing volume. Also in the method, the exhaust flow of plasma processing gas from the gas distribution unit is received into an exhaust region. A pump is operated to provide a suction force to a valve fluidly connected to the exhaust region. And, the valve is operated to control an exhaust flow out of the exhaust region, and thereby control the exhaust flow from the plasma generation volume through the gas distribution unit into the exhaust region.

In one embodiment, operation 503 includes flowing the plasma processing gas from multiple independently controllable gas supply zones within the gas distribution unit into the plasma processing volume. In this embodiment, respective flow rates of plasma processing gas through each of the multiple gas supply zones are controlled to enable control a plasma density across the semiconductor wafer. Also, in one implementation of this embodiment, the multiple independently controllable gas supply zones are concentrically defined across the gas distribution unit. Additionally, in one embodiment, flowing the plasma processing gas from within the gas distribution unit into the plasma processing volume, and directing the exhaust flow of plasma processing gas from within the plasma processing volume through the gas distribution unit, are performed in a pulsed manner to control a residence time of plasma in exposure to the semiconductor wafer.

While this invention has been described in terms of several embodiments, it will be appreciated that those skilled in the art upon reading the preceding specifications and studying the drawings will realize various alterations, additions, permutations and equivalents thereof. It is therefore intended that the present invention includes all such alterations, additions, permutations, and equivalents as fall within the true spirit and scope of the invention.

What is claimed is:

1. A method for semiconductor wafer processing, comprising:
holding a semiconductor wafer in a substantially parallel orientation to a gas distribution unit such that a plasma processing volume is formed between the semiconductor wafer and the gas distribution unit;
flowing a plasma processing gas from within the gas distribution unit into the plasma processing volume in a direction substantially perpendicular to the semiconductor wafer;
directing an exhaust flow of plasma processing gas from within the plasma processing volume through an arrangement of through-holes within the gas distribution unit in a direction substantially perpendicular to the semiconductor wafer, whereby the exhaust flow of plasma processing gas through the arrangement of through-holes within the gas distribution unit is the only exhaust flow of plasma processing gas from within the plasma processing volume; and
transmitting radiofrequency (RF) power to the plasma processing volume to transform the plasma processing gas into a plasma in exposure to the semiconductor wafer; and
controlling a subset of through-holes of the arrangement of through-holes within the gas distribution unit to be open to an exhaust suction and others of the arrangement of through-holes within the gas distribution unit to be closed to the exhaust suction.

2. The method as recited in claim 1, wherein the gas distribution unit is defined as a plate that extends over an entirety of the plasma processing volume.

3. The method as recited in claim 1, wherein the semiconductor wafer is held on an upper surface of a chuck, and wherein the chuck is operated as an electrode to transmit the RF power to the plasma processing volume.

4. The method as recited in claim 1, wherein flowing the plasma processing gas from within the gas distribution unit into the plasma processing volume and directing the exhaust flow of plasma processing gas from within the plasma processing volume through the gas distribution unit are performed in a pulsed manner to control a residence time of plasma in exposure to the semiconductor wafer.

5. The method as recited in claim 1, wherein the plasma processing gas is flowed from multiple independently controllable gas supply zones within the gas distribution unit into the plasma processing volume.

6. The method as recited in claim 5, further comprising:
controlling a flow rate of plasma processing gas through each of the multiple gas supply zones to control a plasma density across the semiconductor wafer.

7. The method as recited in claim 5, wherein the multiple independently controllable gas supply zones are concentrically defined across the gas distribution unit.

8. The method as recited in claim 1, further comprising:
receiving the exhaust flow of plasma processing gas from the gas distribution unit to an exhaust region;
operating a pump to provide a suction force to a valve fluidly connected to the exhaust region; and
operating the valve to control an exhaust flow from the plasma generation volume through the gas distribution unit.

9. A method for semiconductor wafer processing, comprising:
positioning an outer peripheral structure on a top surface of a chuck so as to form an uninterrupted fluid seal between a bottom surface of the outer peripheral structure and the top surface of the chuck, the outer peripheral structure extending in a solid form from a top surface of the outer peripheral structure to the bottom surface of the outer peripheral structure, the outer peripheral structure surrounding and enclosing a perimeter of a plasma generation volume above the chuck;
positioning a gas distribution unit above the plasma generation volume so as to extend across the plasma generation volume in a substantially parallel orientation with respect to the chuck, and so as to form an uninterrupted fluid seal between the top surface of the outer peripheral structure and the gas distribution unit around the perimeter of the plasma generation volume, the gas distribution unit separating the plasma generation volume from an exhaust region, the gas distribution unit including an arrangement of gas supply ports configured to direct an input flow of a plasma process gas into the plasma generation volume, the gas distribution unit including an arrangement of through-holes that each extend through the gas distribution unit to fluidly connect the plasma generation volume to the exhaust region; and controlling a subset of through-holes of the arrangement of through-holes to be open to the exhaust region and others of the arrangement of through-holes to be closed to the exhaust region.

10. A method for semiconductor wafer processing as recited in claim 9, wherein each gas supply port in the arrangement of gas supply ports is configured to direct the input flow of the plasma process gas into the plasma generation volume in a direction substantially perpendicular to the top surface of the chuck.

11. A method for semiconductor wafer processing as recited in claim 10, wherein each through-hole of the arrangement of through-holes is configured to direct an exhaust flow from the plasma generation volume to the exhaust region in a direction substantially perpendicular to the top surface of the chuck.

12. A method for semiconductor wafer processing as recited in claim 9, further comprising:

transmitting radiofrequency (RF) power to an electrode present within the chuck, whereby the RF power is transmitted from the electrode through the plasma generation volume.

13. A method for semiconductor wafer processing as recited in claim 12, further comprising:

electrically connecting the gas distribution unit to a reference ground potential such that the gas distribution unit provides a ground electrode for the plasma generation volume, the gas distribution unit formed of an electrically conductive material.

14. A method for semiconductor wafer processing as recited in claim 13, further comprising:

flowing the plasma process gas through the gas distribution unit into the plasma generation volume; and reducing a pressure within the exhaust region so as to draw gases from the plasma generation volume through the arrangement of through-holes within the gas distribution unit into the exhaust region.

15. A method for semiconductor wafer processing as recited in claim 14, further comprising:

controlling a distance extending across the plasma generation volume in a direction perpendicular to the top surface of the chuck.

16. A method for semiconductor wafer processing as recited in claim 14, further comprising:

separating the arrangement of gas supply ports into multiple gas supply regions; and independently controlling flow of plasma process gas to each of the multiple gas supply regions.

17. A method for semiconductor wafer processing as recited in claim 16, wherein the multiple gas supply regions includes a center gas supply region and one or more annular gas supply regions defined concentrically about the center gas supply region across the gas distribution unit such that each of the one or more annular gas supply regions circumscribes the center gas supply region.

18. A method for semiconductor wafer processing as recited in claim 9, wherein controlling the subset of through-holes is performed by positioning a flow control plate on an upper surface of the gas distribution unit, the flow control plate configured to expose the subset of through-holes to the exhaust region and cover others of the arrangement of through-holes that are not included in the subset of through-holes.

* * * * *